(12) United States Patent
Danielzik et al.

(10) Patent No.: US 6,916,512 B2
(45) Date of Patent: Jul. 12, 2005

(54) METHOD AND DEVICE FOR COATING SUBSTRATES

(75) Inventors: Burkhard Danielzik, Bingen (DE); Markus Kuhr, Woellstein (DE); Wolfgang Moehl, Worms (DE)

(73) Assignee: Schott Glas, Mainz (DE)

(*) Notice: Subject to any disclaimer, the term of this patent is extended or adjusted under 35 U.S.C. 154(b) by 57 days.

(21) Appl. No.: 10/203,770
(22) PCT Filed: Mar. 1, 2001
(86) PCT No.: PCT/EP01/02333
§ 371 (c)(1), (2), (4) Date: Aug. 13, 2002
(87) PCT Pub. No.: WO01/66822
PCT Pub. Date: Sep. 13, 2001

(65) Prior Publication Data
US 2003/0021909 A1 Jan. 30, 2003

(30) Foreign Application Priority Data
Mar. 4, 2000 (DE) .......................... 100 10 766

(51) Int. Cl.⁷ ............................ H05H 1/46; C23C 16/00
(52) U.S. Cl. ................ 427/585; 427/575; 118/723 MW
(58) Field of Search ................................ 118/723 MW, 118/723 MA, 723 ME, 723 MR; 156/345.41, 345.42, 345.36; 427/575, 585

(56) References Cited

U.S. PATENT DOCUMENTS

| 5,234,526 A | | 8/1993 | Chen et al. |
|---|---|---|---|
| 5,364,519 A | | 11/1994 | Inoue |
| 5,580,420 A | * | 12/1996 | Watanabe et al. ............. 216/69 |
| 5,643,365 A | * | 7/1997 | Blinov et al. ....... 118/723 MW |
| 5,645,645 A | | 7/1997 | Inoue |
| 5,647,944 A | * | 7/1997 | Tsubaki et al. ........ 156/345.41 |
| 5,945,177 A | * | 8/1999 | Hack et al. ................. 427/575 |

FOREIGN PATENT DOCUMENTS

| DE | 39 31 713 C1 | 3/1991 | |
|---|---|---|---|
| DE | 196 52 454 A | 6/1998 | |
| DE | 196 52 454 A1 | 6/1998 | |
| EP | 0 326 998 B1 | 8/1994 | |
| JP | 07263348 A | * 10/1995 | ......... H01L/21/205 |
| WO | 95/26427 | 10/1995 | |
| WO | 96/27690 | 9/1996 | |

OTHER PUBLICATIONS

Patent Bastracts of Japan Vo. 1996, No. 02, Feb. 29, 1996 & JP 07 263348 A, Oct. 13, 1995.
Patent Abstracts of Japan vol. 1998, No. 01, Jan. 30, 1998 & JP 09 232099 A, Sep. 5, 1997.
Patent Abstracts of Japan vol. 1998, No. 13, Nov. 30, 1998 & JP 10 223398 A, Aug. 21, 1998.
Box G.E.P., Hunter W.G, Hunter J.S.: "Statistics for Experimenters", Wiley, NY, 1978, Chapter 10 pp. 306–342 and Chapter 15 pp. 510–535.

* cited by examiner

Primary Examiner—Parviz Hassanzadeh
(74) Attorney, Agent, or Firm—Michael J. Striker

(57) ABSTRACT

The method for coating plural surfaces on multiple sides of a substrate, especially a lens, includes launching microwave outputs into a microwave reactor at respective microwave launch sites; selecting respective microwave outputs to be greater than or equal to thresholds at which corresponding plasmas having a reduced permeability to microwave radiation arise in the microwave reactor; setting distances between the plural surfaces and microwave launch sites greater than microwave penetrations depths in the plasmas; placing respective dielectric tuning elements in microwave fields formed from the microwave outputs at the launch sites; and adapting the shapes of the dielectric tuning elements to the plural surfaces to be coated, so that plasma inhomogeneities are corrected and coatings with a uniformity of ±1% are formed on the plural surfaces.

11 Claims, 2 Drawing Sheets

METHOD AND DEVICE FOR COATING SUBSTRATES

BACKGROUND OF THE INVENTION

The invention concerns a method as well as a device for coating substrates.

Particular but not exclusive significance is attributed to the coating of arched surfaces of spectacle lenses or lenses having one or more layers, especially with scratch-proof coatings and uniform, glare-reducing multiple layers.

According to DE 39 31 713 C1, work pieces, in particular plastic lenses, are provided with an abrasion-resistant protective layer by placing them in the center region of a discharge space formed by two electrodes in free-floating fashion with regard for the electrical potential. Because, in the "plasma space", the distribution of charge density is as independent of distance as possible, in contrast to the dark spaces directly next to the electrodes. The gas discharge is produced by applying a radio frequency field between the electrodes. This method has the disadvantage that the two sides of the substrate are coated differently, as one side always faces the grounded electrode and the plasma has other properties there than in the vicinity of the electrode launching the radio frequency.

Application WO 96/27690 describes a PECVD ("Plasma Enhanced Chemical Vapor Deposition") method and a device for the two-sided coating of substrates, preferably spectacle lenses, by means of microwave excitation. A distinct plasma is used for each surface to be coated. In order to keep the heat load of the substrate low, the use of a pulsed discharge is recommended. No mention is made of which uniformities can be obtained in the coating and how they can be influenced.

Application WO 95/26427 A1 describes a PICVD method and a device for producing uniform coatings on lenses made of glass or plastic, in which the substrate surface to be coated is arranged opposite to the gas passage surface of a gas shower. In a preferred embodiment, the gas shower is developed as a zone shower by means of which locally different gas flows arise on the substrate. Individual microwave and gas flow parameters are used for each substrate form. Although uniformities that are adequate for anti-glare coatings as well are obtained, the determination of individual process parameters and their control is very costly.

A method and a device for the exterior coating of lamps is described in DE 196 52 454 A1. Damage caused by the microwaves to the lamp to be coated is prevented by selecting a microwave output launched into the microwave reactor that is greater than or equal to a threshold value at which a plasma having reduced permeability to microwave radiation arises. The microwaves are therefore shielded by the plasma. No statement is made about the layer uniformities that can be obtained.

A diamond coating method for the partial diamond coating of drills and sealing rings using UHF or microwaves is described in U.S. Pat. No. 5,645,645.

EP 0 326 998 B1 describes a method for the microwave-CVD coating of flat substrates.

In the devices according to U.S. Pat. No. 5,645,645 or EP 0 326 998 B1 there is an interplay of conventional tuning elements in the form of metallic slides and perforated metal plates. The conventional tuning elements serve to match impedance, which results in a higher microwave intensity. The structure of the microwave dispersion is not changed as a result, it is only shifted or intensified. In EP 0 326 998 B1, the perforated metal plate serves only to scatter the reaction flow. In the device according to U.S. Pat. No. 5,645,645, the perforated plate forms the launch site for the plasma and has an effect on the microwaves that is similar to a shield.

SUMMARY OF THE INVENTION

The object of the invention is to provide a method and a device to enable the coating—in economical fashion—of in particular substrates having sharp bends such as, for example, lenses and spectacle lenses, whereby a high uniformity of layer thickness is to be obtained. The uniformity should be approximately ±1% in order to suffice for coating with scratch-proof and anti-glare layers. Uniformity is thereby defined as 100% multiplied by the standard deviation of the mean layer thickness divided by the layer thickness.

A method in accordance with the present invention includes the steps of launching a microwave output into the microwave reactor, selecting the microwave output greater than or equal to a threshold value at which a plasma having a reduced permeability to microwave radiation arises; using a distinct plasma for each surface to be coated that is coupled in at a microwave launch site; arranging a surface to be coated perpendicularly to a direction of spreading of the plasma used for coating; setting a distance between a substrate surface to be coated and a respective launch site greater than a penetration depth of microwaves in the plasma; influencing a microwave field distribution by a placement of at least one dielectric tuning element in a microwave field in a region of the microwave launch site in such a fashion that in homogeneities existing in a distribution of plasma density are corrected.

This object is obtained with a method according to claim 1 and by means of a device according to claim 8.

A basic uniformity of the layer thickness is ensured when the substrate surface to be coated is located in a region of the plasma in which the plasma is impermeable to the microwaves, and the distribution of plasma density is constant in the first iteration. The shielding effect of the plasma becomes even more significant in the case of two- or more-sided coating, as the shielding ensures that the two microwave fields do not influence each other, and each microwave field only influences the respective plasma.

Inhomogeneities in the microwave field bring about inhomogeneities in the distribution of plasma density. The microwave field distribution can be influenced by placing dielectric tuning elements in the microwave field in the region of the microwave launch sites. The phase of the microwave changes on the surface of the dielectric tuning element. Additionally, the microwave field is weakened, and the propagation speed of the wave is slower inside the dielectric tuning element. This modifies the electrical field distribution and, as a consequence, the distribution of plasma density dependent on it, and the coating result induced as a result. Depending on the shape of the dielectric tuning elements selected, coatings are obtained that have a uniformity of nearly ±1%.

In the case of coating a concave surface, the coating at the edges is greater than in the center in a wide parameter range. The coating becomes more uniform as the distance from the microwave launch site increases. In the case of convex surfaces, the coating becomes more uniform up to a certain distance. If the distance is increased even further, the uniformity of the coating decreases once more.

The dielectric tuning element should have more material in locations where the microwave field is to be weakened, i.e., where an over-heightening of the layer thickness is to be avoided.

The tuning element is advantageously arranged behind the launch site of the microwaves in the microwave waveguide. The tuning element preferably remains in this location during the procedure.

The method according to the invention is preferably carried out using a microwave PICVD ("Plasma Induced Chemical Vapor Deposition") method. It has proven advantageous to activate the distances between substrate surface and microwave launch site depending on the process parameters of microwave output, pressure, microwave pulse duration and microwave pulse separation as well as the duration of the microwave pulse separation as a function of the pressure, the mass flow of the reaction gas and the distance between the substrate surface and microwave launch site. The method of statistical experimental design is used hereby, as described, for example, in: Box G. E. P., Hunter W. G., Hunter J. S.: Statistics for Experimenters, 1978, Wiley, N.Y.

In general, the variables relevant in each case are thereby varied at random depending on the surface of the substrate to be coated, and the individual parameters are then optimized for uniform coating while keeping the remaining specified parameters constant in accordance with the respective results obtained. This measure is carried out only for limit forms of lenses to reduce the experimental cost, and the parameters for coating the intermediate form are determined by means of interpolation.

For a certain substrate type, for example, three of the parameters of microwave output, pressure, microwave pulse duration and microwave separation and random variation of the distance(s) between the substrate and the microwave launch site are kept constant in a first experimental sequence while the fourth parameter in each case is optimized for uniform coating in accordance with the respective results obtained.

It is also possible to run a second experimental sequence for a certain substrate type, keeping two of the parameters of pressure, reaction mass flow and distance/distances between the substrate and microwave launch site and random variation of the microwave pulse separations constant and optimizing the third parameter in each case for uniform coating in accordance with the respective results obtained.

It has proven advantageous to switch between continuous gas flow between carrier gas and reaction gas and vice-versa without interrupting the gas flow. The plasma is ignited by microwaves during the continuous gas flow.

The gas is preferably introduced as close as possible to the surface to be coated. The closer the gas is introduced to the substrate surface, the shorter the pulse separations can be selected. The shortest possible pulse duration should be selected as well so that the gas flow can be viewed as still during the microwave pulse. This makes it easier to model the coating process.

Preferred reaction gasses are hexamethyldisiloxane and titanium tetrachloride.

The dielectric tuning elements that are arranged in the region of the microwave launch sites in the device according to the invention are preferably composed of materials having very high dielectric constants. Quartz and polytetrafluoroethylene are particularly preferred materials.

The dielectric tuning elements are preferably arranged on the atmospheric side of the launch sites and on the microwave window(s).

In a preferred embodiment, the outer contour of the dielectric tuning element corresponds to the inner contour of the waveguide in which it is attached.

The shape of the dielectric tuning elements is advantageously adapted to the substrate surface to be coated and the desired coating thickness. The dielectric tuning element can be formed as a ring or a disk or a cone or a pyramid. Combinations of various dielectric tuning elements can be used as well, such as a disk with a ring or two disks having different diameters, each of which is arranged coaxially in relation to the other. Depending on the microwave output, the bend of the surface to be coated, and the desired coating, the dielectric tuning elements have a material thickness of 5 to 50 mm.

The gas inlet is advantageously situated on the substrate holder.

The distance between the substrate holder and the microwave launch site should be selected so that the distance between the surface to be coated and the launch site is between 5 and 80 mm.

The invention will now be explained in greater detail with reference to the following figures.

DESCRIPTION OF THE PREFERRED EMBODIMENTS

Figure 1A:
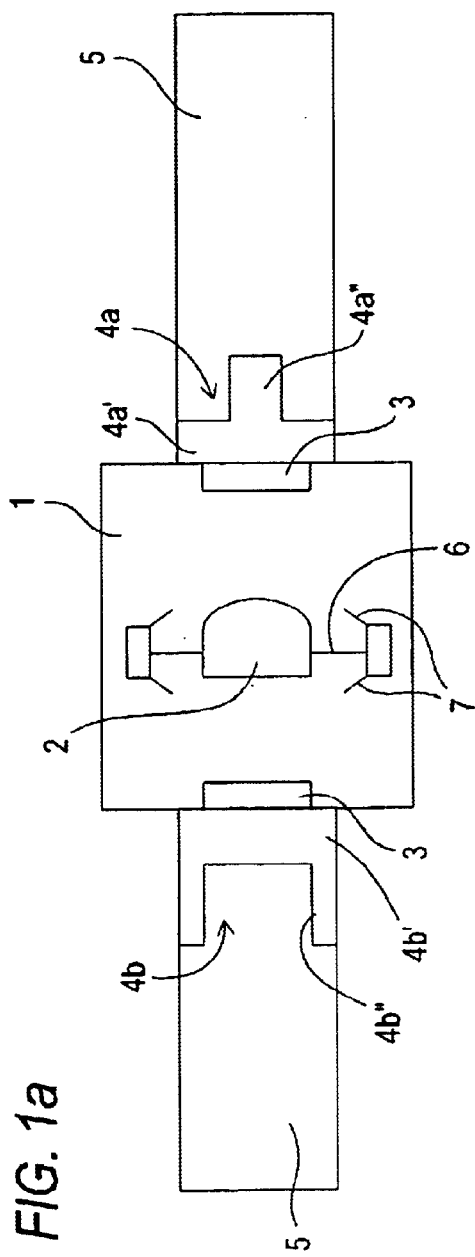
FIG. 1a is a diagrammatic cross-sectional view of the device according to the invention for coating a piano-convex substrate.

FIG. 1 represents a device according to the invention for the two-sided coating of an arched substrate. It has a coating reactor 1 in which the substrate 2 is secured by means of a substrate holder 6. Gas inlets 7 are situated in the immediate vicinity of the substrate holder 6. In the present case, the gas supply is designed as a rotationally-symmetric gas shower. The gas outlet is not shown, to improve clarity. The substrate 2 is convex on one side and flat on the other side. The substrate 2 is arranged in the coating reactor 1 in such a fashion that the surfaces to be coated are parallel to the microwave windows 3. Microwave waveguides 5 abut the microwave windows on both sides.

Dielectric tuning elements 4a, b are placed on the atmospheric side of the microwave launch sites 3, i.e., in the waveguides 5. The dielectric tuning element 4a on the convex side of the substrate 2 is formed out of two partial elements 4a' and 4a". It is a disk 4a', the outer diameter of which corresponds to the inner diameter of the waveguide 5 and a disk 4a" having a smaller diameter that is placed coaxially on the larger disk 4a' and, as a result, weakens the microwave field and the plasma distribution in the region of the center of the convex substrate surface. The dielectric tuning element 4b that is opposite to the flat side of the substrate 2—whereby the flat side is considered a borderline case for concave surfaces—is composed of a disk 4b', the outer diameter of which corresponds to the inner diameter of the waveguide 5—analogous to the disk 4a'—and a ring element 4b". As a result, the microwave field distribution and plasma density distribution is weakened at the edge of the substrate. The dielectric tuning elements 4a,b are inserted into the respective waveguide 5 until they stop at the respective microwave window 3.

Figure 1B:
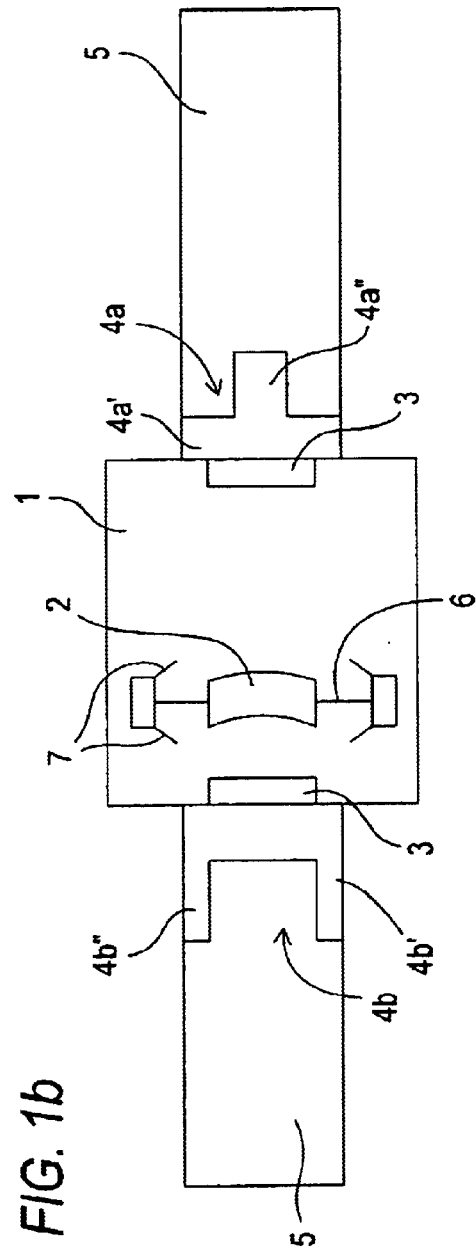
FIG. 1b is a diagrammatic cross-sectional view of the device according to the invention for coating a convex substrate.

It has also proven, by the way, that the substrate 2 is to be arranged, advantageously, off-center in the coating reactor 1, in particular when the substrate 2 is concave on one side and convex on the other side, as shown in FIG. 1b. The concave surface should be situated further away from the microwave launch site 3 than the convex surface is. This is shown in FIG. 1b. The layout shown in FIG. 1b is analogous to the layout shown in FIG. 1a.

Figure 2A:
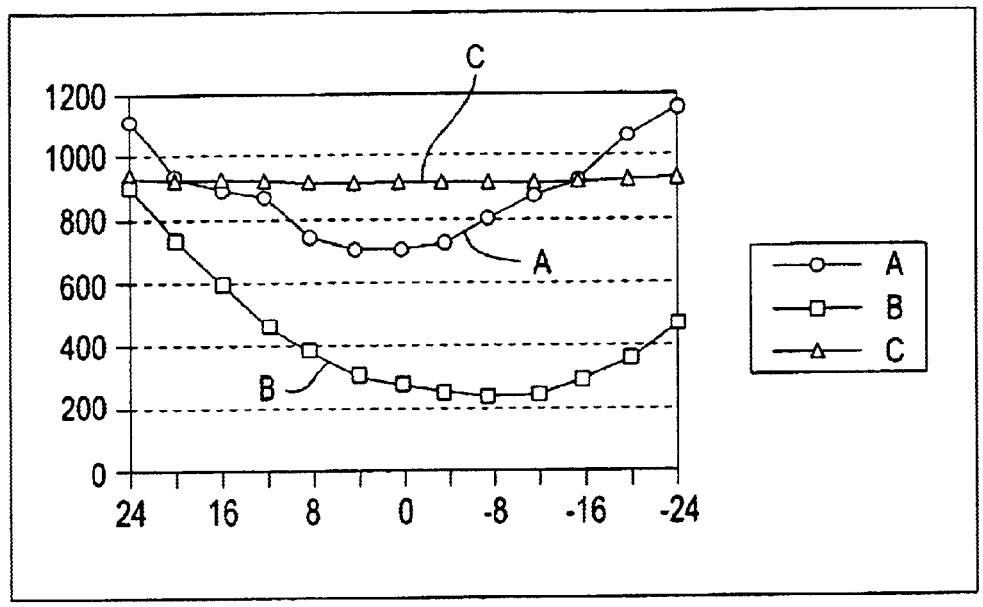
FIGS. 2a and 2b are respective graphical illustrations showing the variation of coating thickness with position on the substrate with and without dielectric tuning according to the invention.
Figure 2B:
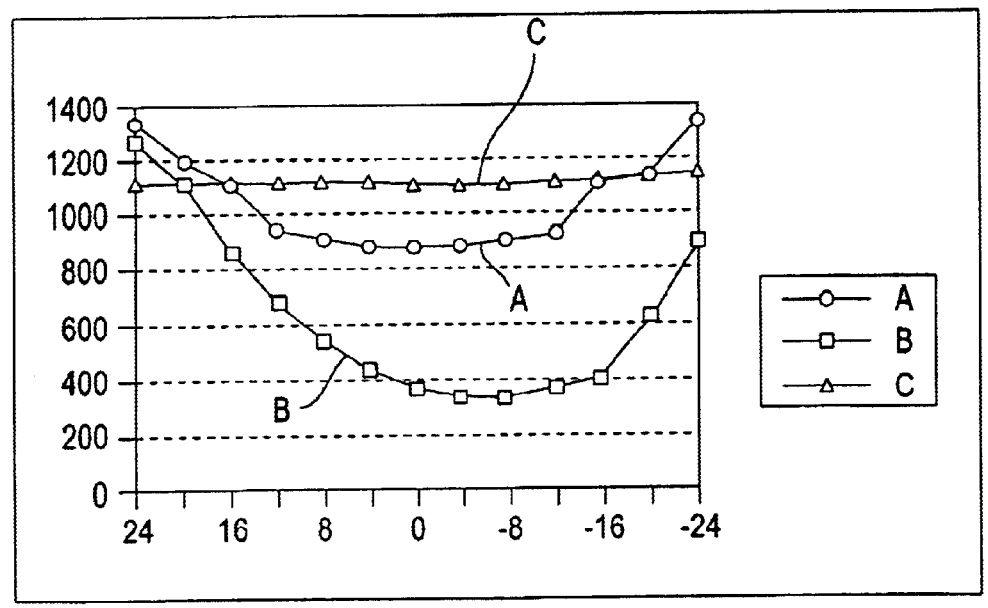

Measurements of the coating of a concave surface have been carried out at two different distances from the microwave launch site. The results are presented in FIGS. 2a and 2b. The location coordinate in the radial direction on the substrate is plotted on the abscissa, and the zero point is in the center of the substrate surface. The corresponding layer thicknesses are plotted on the ordinates. The measurements were carried out once without a dielectric tuning element (measuring point A), once with a disk-shaped dielectric tuning element (measuring point B)—whereby the disk is dimensioned in such a fashion that the field is weakened in the center of the surface to be coated—and with an annular dielectric tuning element (measuring point C), which weakens the field at the edge of the surface to be coated. The measurement shown in FIG. 2a shows a coating in which the concave substrate surface was 34 mm away from the microwave launch site. The distance is always measured with regard for the shortest distance, i.e., in the case of concave lenses, from the edge of the lens outward and, in the case of convex lenses, from the center of the lens outward. In the case of the measurement shown in FIG. 2b, the concave substrate surface was 39 mm away from the microwave launch site. Uniformity is defined as 100% multiplied by the standard deviation of the mean layer thickness divided by the layer thickness.

In both measurements, the coating without a dielectric tuning element is very inhomogeneous. The layer thicknesses are much greater on the edges of the concave substrate than in the middle of the concave substrate.

If a dielectric tuning element is used that weakens the field in the center of the surface to be coated (measuring point B), this effect is even increased. If, on the other hand, an annular dielectric tuning element is arranged in the waveguide at the microwave launch site, so that the field is weakened at the edge of the substrate to be coated, a constant layer thickness is obtained over the entire concave substrate.

What is claimed is:

1. A method for simultaneously coating plural surfaces on multiple sides of a substrate by means of a microwave plasma chemical vapor deposition process, said method comprising the steps of:
    a) arranging said substrate in a microwave reactor and launching plural microwave outputs into the microwave reactor at respective microwave launch sites, so that said plural surfaces to be coated on the substrate are perpendicular to spreading directions of corresponding plasmas formed by means of the respective microwave outputs in said microwave reactor;
    b) selecting the respective microwave outputs to be greater than or equal to a threshold value at which said corresponding plasmas have reduced permeability to microwave radiation;
    c) setting corresponding distances between said plural surfaces to be coated and said respective microwave launch sites greater than penetration depths of microwaves in said corresponding plasmas;
    d) placing respective dielectric tuning elements in corresponding microwave fields formed from said respective microwave outputs at said microwave launch sites; and
    e) adapting respective shapes of said dielectric tuning elements to corresponding shapes of said plural surfaces to be coated, so that inhomogeneities in plasma distributions in said plasmas are corrected and said plural surfaces are simultaneously provided with coatings of uniform thickness by the microwave plasma chemical vapor deposition process.

2. The method as defined in claim 1; and further comprising using a plasma induced chemical vapor deposition method to deposit said coatings on said plural surfaces to be coated.

3. The method as defined in claim 2; and further comprising providing a continuous gas flow of a carrier gas or a reaction gas through said microwave reactor, igniting said plasmas during said continuous gas flow and switching between said carrier gas and said reaction gas during said continuous gas flow.

4. The method as defined in claim 3; and further comprising optimizing said corresponding distances between the substrate and the respective microwave launch sites by statistical experimental design according to parameters of the microwave plasma induced chemical vapor deposition method and wherein said parameters include microwave output, pressure, microwave pulse duration and/or microwave pulse separation.

5. The method as defined in claim 4; and further comprising optimizing a duration of the microwave pulse separation by statistical experimental design according to the pressure, reaction gas mass flow and the corresponding distances between the plural surfaces to be coated and the respective microwave launch sites.

6. The method as defined in claim 3; and further comprising introducing the carrier gas and the reaction gas as close as possible to said plural surfaces to be coated.

7. The method as defined in claim 3; wherein said reaction gas comprises hexamethyldisiloxane or titanium tetrachloride.

8. The method as defined in claim 3; wherein each of said respective dielectric tuning elements for said microwave launch sites consists of quartz or polytetrafluoroethylene.

9. The method as defined in claim 3, wherein said coatings formed on said plural surfaces have a uniformity of ±1%.

10. The method as defined in claim 1, wherein said substrate is a lens, one of said plural surfaces is a concave surface, said concave surface is associated with first and second dielectric tuning elements and said first and second dielectric tuning elements consist of a disk element and a ring element, said ring element is placed against said disk element and said disk element and said ring element have respective outer diameters each corresponding to an inner diameter of a waveguide through which said microwaves pass.

11. The method as defined in claim 1, wherein wherein said substrate is a lens, one of said plural surfaces is a convex surface, said convex surface is associated with first and second dielectric tuning elements and said first and second dielectric tuning elements consist of two disk elements, one of said disk elements has an outer diameter corresponding to an inner diameter of a waveguide through which said microwaves pass and another of said disk elements has an outer diameter that is smaller than said inner diameter of said waveguide.

* * * * *